(12) United States Patent
Miyashita

(10) Patent No.: US 8,023,911 B2
(45) Date of Patent: Sep. 20, 2011

(54) AMPLIFYING DEVICE AND RADIO

(75) Inventor: Daisuke Miyashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 495 days.

(21) Appl. No.: 12/271,363

(22) Filed: Nov. 14, 2008

(65) Prior Publication Data

US 2009/0131099 A1   May 21, 2009

(30) Foreign Application Priority Data

Nov. 15, 2007   (JP) ................. 2007-296743

(51) Int. Cl.
*H04B 1/04* (2006.01)
(52) U.S. Cl. .............. 455/130; 455/194.2; 455/253.2; 455/311; 455/340; 330/250; 330/259; 330/260; 330/261
(58) Field of Classification Search .......... 455/130, 455/194.2, 253.2, 311, 340, 341; 330/259, 330/260, 261, 285, 296, 250, 280, 288
See application file for complete search history.

(56) References Cited

U.S. PATENT DOCUMENTS

| | | | | |
|---|---|---|---|---|
| 4,859,955 A | * | 8/1989 | Trethewey | 327/170 |
| 5,539,308 A | * | 7/1996 | Teramae et al. | 324/173 |
| 5,883,535 A | | 3/1999 | Kato | |
| 6,831,515 B2 | | 12/2004 | Johnson | |
| 7,081,789 B2 | * | 7/2006 | Klemmer | 327/554 |
| 2007/0273441 A1 | | 11/2007 | Watanabe | |

FOREIGN PATENT DOCUMENTS

| | | |
|---|---|---|
| JP | 2003-37449 | 2/2003 |
| JP | 2005-341477 | 12/2005 |

OTHER PUBLICATIONS

Office Action issued Apr. 12, 2011, in Japan Patent Application No. 2007-296743 (with English translation).

* cited by examiner

*Primary Examiner* — Tuan Pham
(74) *Attorney, Agent, or Firm* — Oblon, Spivak, McClelland, Maier & Neustadt, L.L.P.

(57) ABSTRACT

An amplifying device has an amplifier which amplifies an input signal supplied from an input terminal and outputs the amplified input signal, a feedback loop which has at least one of a resistive element and a capacitance connected between an output terminal of the amplifier and the input terminal, a variable current unit which adjusts a current value in accordance with a controlling signal and supplies an operating current to the amplifier, a signal analyzing unit which generates a time difference signal having a value corresponding to a slew rate of the input signal and outputs the time difference signal, and a controlling unit which generates the controlling signal in accordance with the time difference signal and outputs the controlling signal.

10 Claims, 4 Drawing Sheets

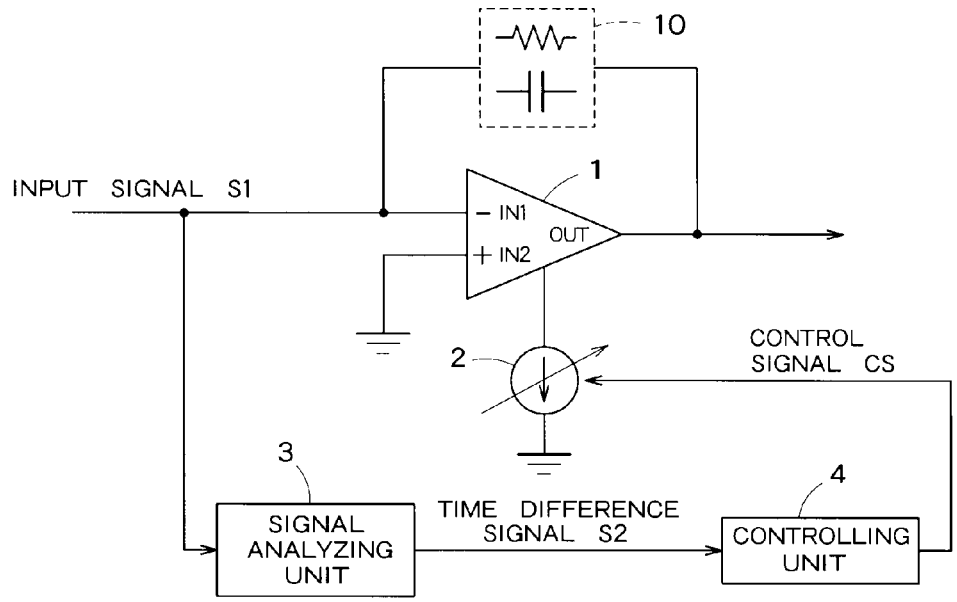
F I G. 1
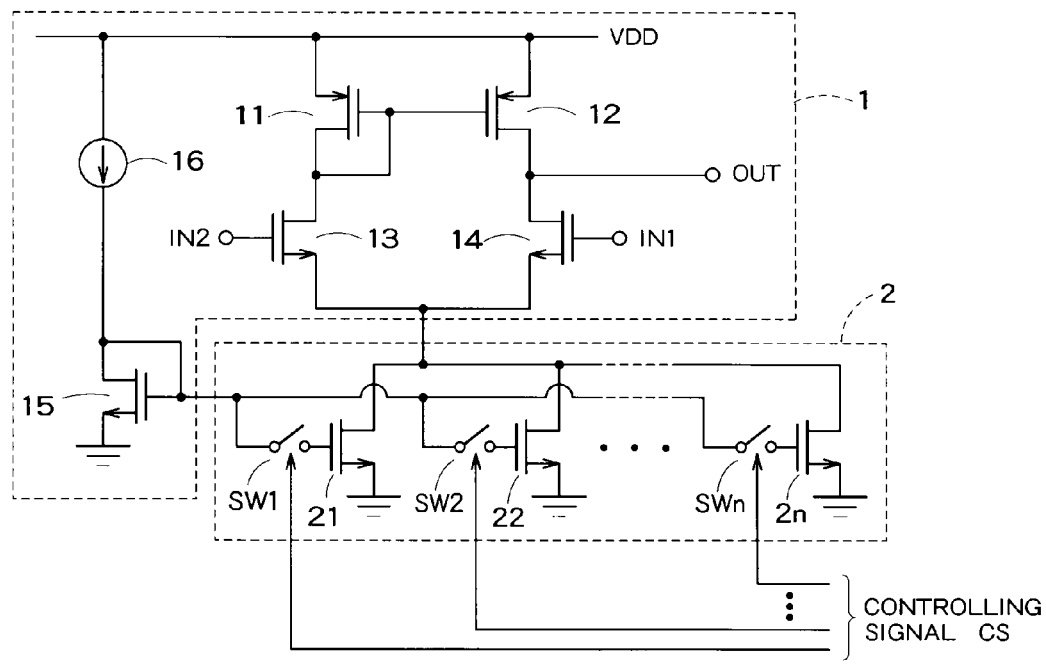
F I G. 2

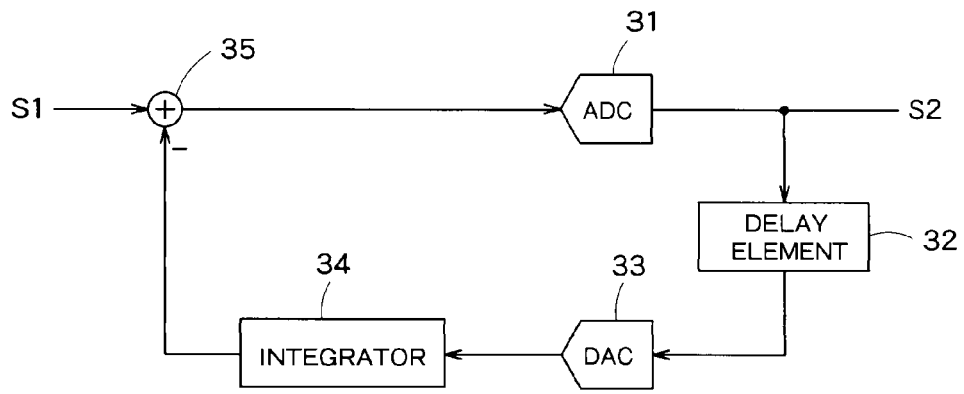
F I G. 3
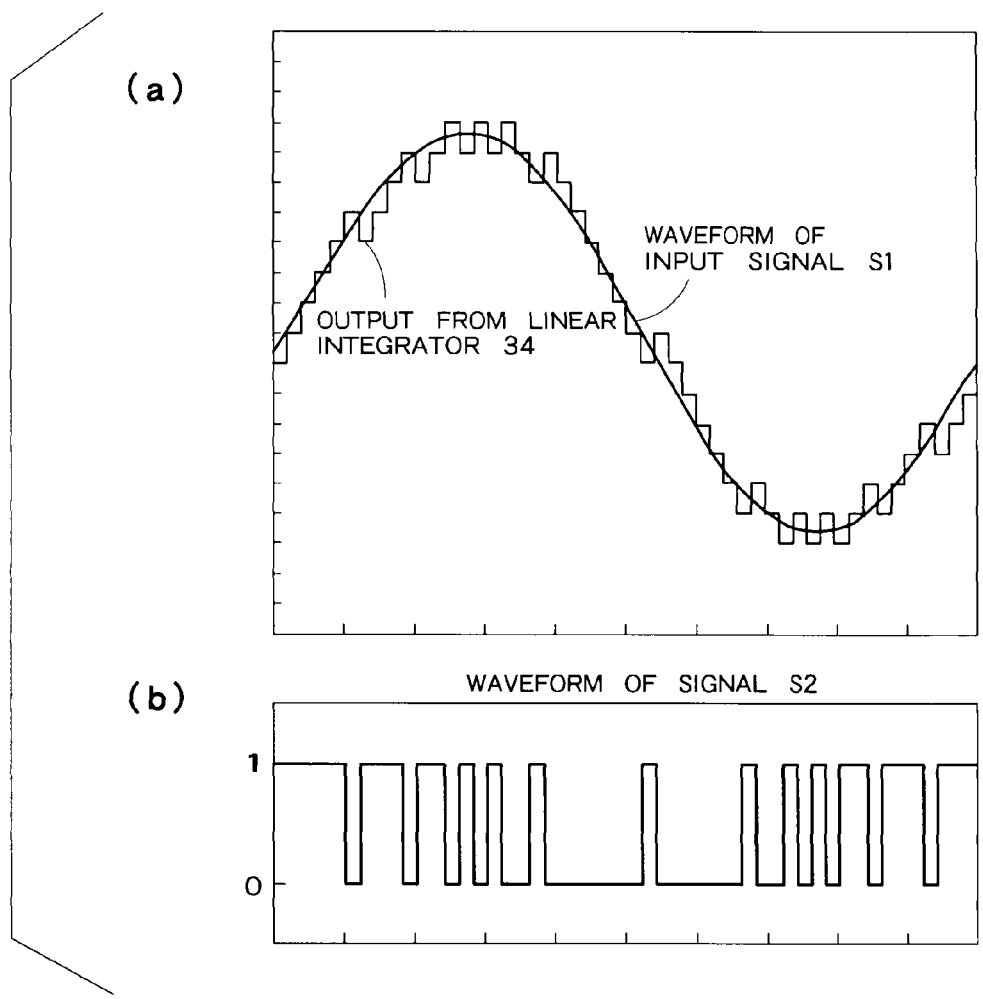
F I G. 4

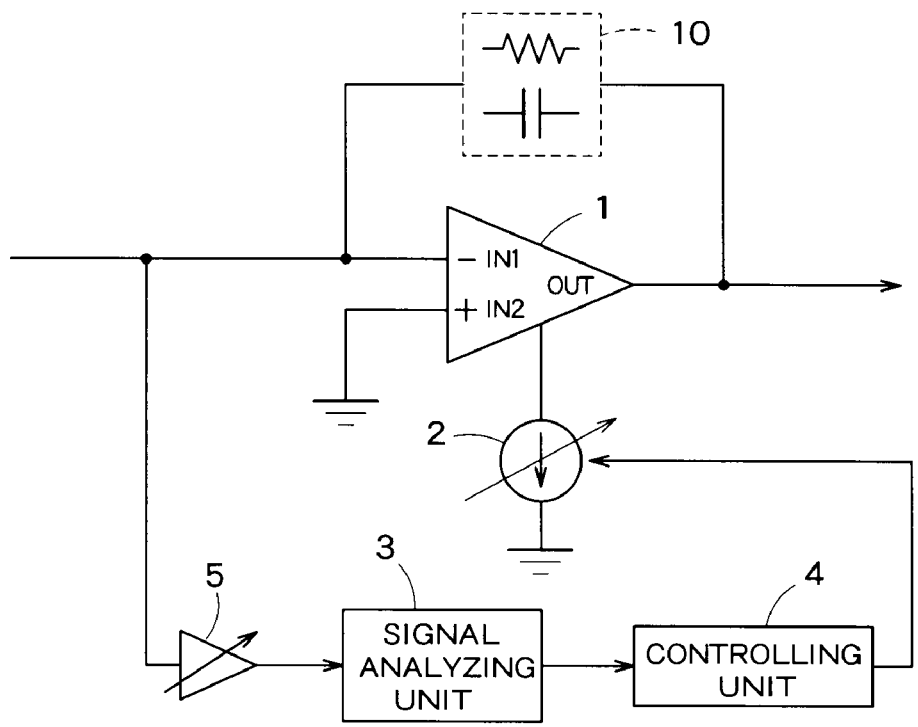
F I G. 5
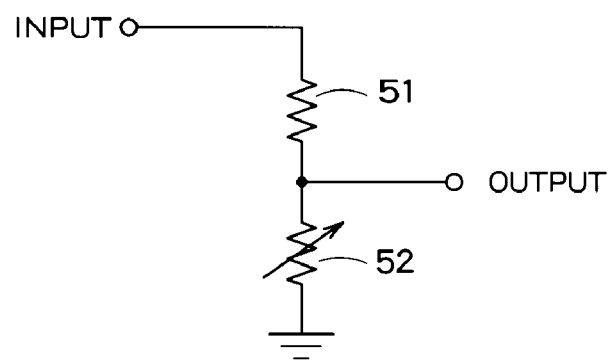
F I G. 6

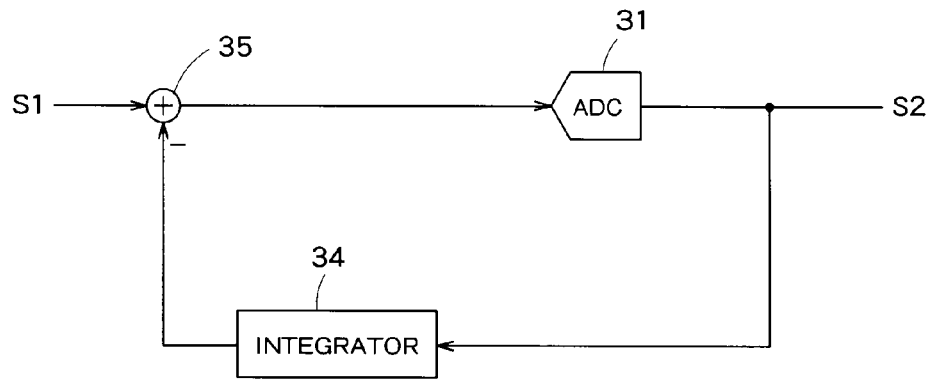
F I G. 7
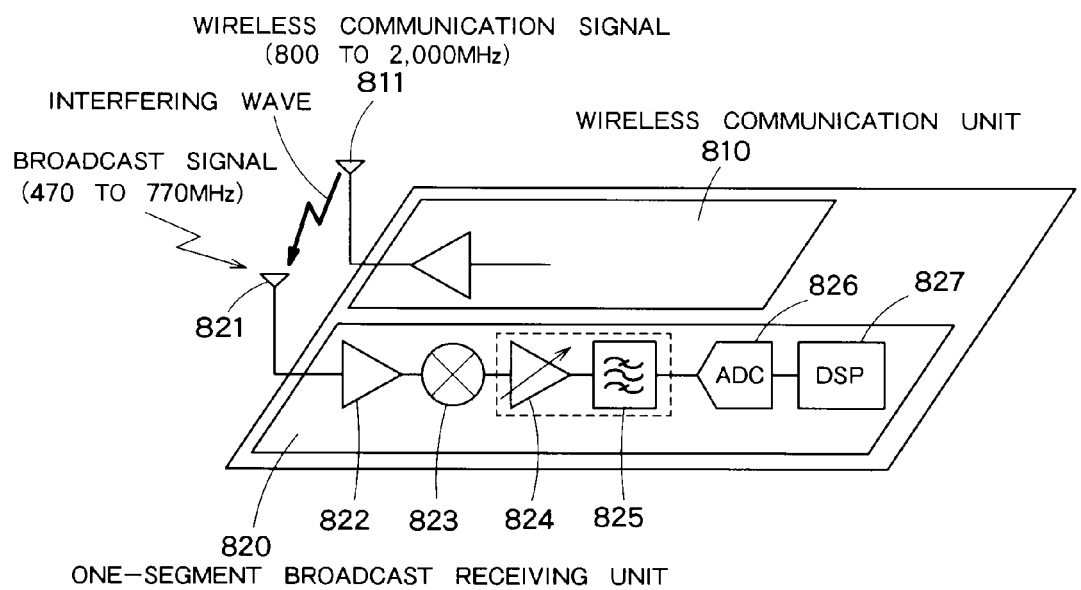
F I G. 8

US 8,023,911 B2

AMPLIFYING DEVICE AND RADIO

CROSS REFERENCE TO RELATED APPLICATION

This application is based upon and claims the benefit of priority from the Japanese Patent Application No. 2007-296743, filed on Nov. 15, 2007, the entire contents of which are incorporated herein by reference.

BACKGROUND OF THE INVENTION

The present invention relates to an amplifying device and a radio.

Terrestrial digital broadcasting has a 13-segments structure. A service to receive one of 13 segments, i.e., a so-called one-segment broadcasting service is available to mobile terminals.

A one-segment broadcast signal may be transmitted from a long distance. In this case, a one-segment broadcast receiving unit in a cellular phone handset having a one-segment broadcast receiving function handles a very weak signal. A cellular communication signal which is transmitted from a transmitter in the immediate vicinity of the one-segment broadcast receiving unit and whose frequency is higher than that of a one-segment broadcast signal by several tens of MHz is very strong and serves as an interfering wave for the one-segment broadcast receiving unit.

Amplifying circuits and filtering circuits which handle a signal obtained by downconverting a one-segment broadcast signal are each often composed of a circuit using an operational amplifier. An operational amplifier has a parameter called a slew rate which represents a voltage variation (determined by signal amplitude×frequency) allowed per unit time.

In order to amplify and output a signal which is high in frequency and strength (which has a large amplitude) without distorting the signal, an operational amplifier needs to have a high slew rate. A slew rate is generally proportional to current consumption. It is thus necessary to increase current consumption in order to achieve a high slew rate.

A low slew rate suffices for a cellular phone handset having a one-segment broadcast receiving function as described above in the absence of an interfering wave (a cellular communication signal). However, a cellular phone handset needs to use an operational amplifier with a high slew rate in preparation for issuance of an interfering wave by the cellular phone handset. This causes a large current to be applied even when the slew rate of a signal is low and increases costs.

SUMMARY OF THE INVENTION

According to one aspect of the present invention, there is provided an amplifying device comprising:
an amplifier which amplifies an input signal supplied from an input terminal and outputs the amplified input signal;
a feedback loop which has at least one of a resistive element and a capacitance connected between an output terminal of the amplifier and the input terminal;
a variable current unit which adjusts a current value in accordance with a controlling signal and supplies an operating current to the amplifier;
a signal analyzing unit which generates a time difference signal having a value corresponding to a slew rate of the input signal and outputs the time difference signal; and
a controlling unit which generates the controlling signal in accordance with the time difference signal and outputs the controlling signal According to one aspect of the present invention, there is provided a radio comprising:
a wireless communication unit which transmits and receives a wireless communication signal;
an antenna which receives a broadcast signal;
a first amplifying circuit which amplifies the broadcast signal received by the antenna;
a mixer which downconverts an output signal from the first amplifying circuit to a baseband signal;
a second amplifying circuit which amplifies the baseband signal and has an amplifying device including an amplifier that amplifies an input signal supplied from an input terminal and outputs the input signal, a feedback loop that has at least one of a resistive element and a capacitance connected between an output terminal of the amplifier and the input terminal, a variable current unit that adjusts a current value in accordance with a controlling signal and supplies an operating current to the amplifier, a signal analyzing unit that generates a time difference signal having a value corresponding to a slew rate of the input signal and outputs the time difference signal, and a controlling unit that generates the controlling signal in accordance with the time difference signal and outputs the controlling signal;
a filter which receives an output signal from the second amplifying circuit;
an analog/digital converter which analog/digital-converts an output signal from the filter and outputs a digital signal; and
a digital signal processing circuit which decodes the digital signal.

BRIEF DESCRIPTION OF THE DRAWINGS

FIG. 1 is a diagram showing the schematic configuration of an amplifying device according to an embodiment of the present invention;

FIG. 2 is a diagram showing the schematic configuration of an operational amplifier and a variable current unit;

FIG. 3 is a diagram showing the schematic configuration of a signal analyzing unit;

FIGS. 4(a) and 4(b) are waveform charts of an input signal and an output signal, respectively, for the signal analyzing unit;

FIG. 5 is a diagram showing the schematic configuration of the amplifying device according to a modification;

FIG. 6 is a diagram showing the schematic configuration of an attenuator;

FIG. 7 is a diagram showing the schematic configuration of the signal analyzing unit according to a modification; and FIG. 8 is a diagram showing the schematic configuration of a cellular phone handset having a broadcast receiving function.

DESCRIPTION OF THE EMBODIMENTS

An embodiment of the present invention will be described below with reference to the drawings.

FIG. 1 shows the schematic configuration of an amplifying device according to the embodiment of the present invention. The amplifying device includes an operational amplifier 1, a variable current unit 2, a signal analyzing unit 3, and a controlling unit 4.

The operational amplifier 1 amplifies an input signal S1 supplied through an input terminal IN1 and outputs the amplified input signal S1 from an output terminal OUT. A feedback element 10 having at least one of a resistive element and a capacitance is connected between the output terminal OUT and the input terminal IN1, thereby forming a feedback loop which feeds back an output to an input. An input terminal IN2 is grounded.

The operational amplifier 1 is supplied with an operating current by the variable current unit 2. The current value of the current determines the slew rate of the operational amplifier 1.

The variable current unit 2 adjusts the current value of an output current in accordance with a controlling signal CS outputted from the controlling unit 4.

FIG. 2 shows an example of the circuit configuration of the operational amplifier 1 and variable current unit 2. The variable current unit 2 has n (n is an integer not less than 2) transistors 21 to 2n which are connected in parallel and n switches SW1 to SWn which are connected to gate electrodes of the transistors 21 to 2n, respectively. Source electrodes of the transistors 21 to 2n are grounded.

The switches SW1 to SWn are on-off controlled in accordance with the controlling signal CS.

In a transistor 11, a source electrode is connected to a power supply voltage line VDD, and a gate electrode and a drain electrode are connected to a gate electrode of a transistor 12 and a drain electrode of a transistor 13.

A source electrode of the transistor 12 is connected to the power supply voltage line VDD, and a drain electrode is connected to a drain electrode of a transistor 14 and the output terminal OUT.

A gate electrode of the transistor 13 is connected to the input terminal IN2, and a gate electrode of the transistor 14 is connected to the input terminal IN1.

A source electrode of the transistor 13 and a source electrode of the transistor 14 are connected to drain electrodes of the transistors 21 to 2n.

A constant current source 16 is connected between the power supply voltage line VDD and a drain electrode and a gate electrode of a transistor 15. A source electrode of the transistor 15 is grounded, and the gate electrode and drain electrode are connected to the gate electrodes of the transistors 21 to 2n through the switches SW1 to SWn.

The value of a current supplied to the operational amplifier 1 increases with an increase in the number of ones of the switches SW1 to SWn which are on. The value of a current supplied to the operational amplifier 1 can be adjusted by changing the number of ones of the switches SW1 to SWn which are on.

The signal analyzing unit 3 is supplied with the input signal S1 and outputs a time difference signal S2 corresponding to the slew rate of the input signal S1.

FIG. 3 shows an example of the schematic configuration of the signal analyzing unit 3. An example of the signal analyzing unit 3 is a linear Δ modulator which includes an AD converter (analog/digital converter) 31, a delay element 32, a DA converter (digital/analog converter) 33, a linear integrator 34, and an adder 35.

The number of digital output levels of the AD converter 31 and the number of digital input levels of the DA converter 33 may each be set to an arbitrary value. A case where an output from the AD converter 31 and an input to the DA converter 33 are each "1" or "0", i.e., the case of one bit will be described here. In this case, the AD converter 31 operates as a comparator which judges whether an inputted signal is positive or negative.

The DA converter 33 outputs a voltage (or current) of +Δ if an input is "1" and outputs a voltage of −Δ if an input is "0". The linear integrator 34 adds a past output from the DA converter 33 and outputs the sum.

The operation of the linear Δ modulator will be described. In the adder 35, an output from the linear integrator 34 is subtracted from the input signal S1. If the output from the linear integrator 34 is smaller than the input signal S1, the difference becomes positive. Accordingly, the signal S2 with a value of "1" is outputted from the AD converter 31.

A voltage of +Δ is outputted from the DA converter 33, and the voltage is added to an output value in the previous cycle by the linear integrator 34. For this reason, an output from the linear integrator 34 becomes larger than the output value in the previous cycle by Δ. One cycle here corresponds to one sampling action in sampling by the AD converter 31.

On the other hand, if the output from the linear integrator 34 is larger than the input signal S1, since the input value to the AD converter 31 becomes negative, the signal S2 with a value of "0" is outputted from the AD converter 31.

A voltage of −Δ is outputted from the DA converter 33, and the voltage is added to the output value in the previous cycle by the linear integrator 34. For this reason, the output from the linear integrator 34 becomes smaller than the output value in the previous cycle by Δ.

FIGS. 4(a) and 4(b) respectively show an output from the linear integrator 34 and the waveform of the signal S2 outputted from the AD converter 31 when the above-described operation is applied to the sinusoidal input signal S1 shown in FIG. 4(a). The output from the linear integrator 34 changes to follow the input signal S1.

As can be seen from FIGS. 4(a) and 4(b), if the rate of change of the input signal S1 is positive and high, i.e., the slew rate of the input signal S1 is positive and high, the signal S2 with a value "1" is outputted more often. If the rate of change of the input signal S1 is negative and high, i.e., the slew rate of the input signal S1 is negative and high, the signal S2 with a value "0" is outputted more often. If the rate of change of the input signal S1 is low, i.e., the slew rate is low, "1" and "0" are outputted with almost equal frequency.

The controlling unit 4 generates the controlling signal CS in accordance with the time difference signal S2 and outputs the controlling signal CS. For example, if "1" or "0" continues to be outputted as the value of the signal S2 over three cycles, the number of ones of the switches SW1 to SWn of the variable current unit 2 which are to be turned on is increased by one. If "1" or "0" continues to be outputted over three more cycles, the number of switches to be turned on is further increased by one. This is because when "1" or "0" continues to be outputted as the value of the signal S2, the rate of change (the slew rate) of the input signal S1 is positive or negative and high.

In this case, three cycles are required to judge whether the slew rate of the input signal S1 is high. The influence of three cycles can be curbed by setting a sampling frequency to be sufficiently higher than the frequency of the input signal S1.

For example, if "1" and "0" are alternately outputted as the value of the signal S2 over five cycles, one output per cycle, the number of ones of the switches SW1 to SWn of the variable current unit 2 which are to be turned on is reduced by one. This is because when "1" and "0" are alternately outputted as the value of the signal S2, the rate of change of the input signal S1 is low, i.e., the slew rate is low.

The amplifying device according to this embodiment increases a current to be supplied to the operational amplifier 1 if the slew rate of an input signal is high and reduces the current if the slew rate of an input signal is low.

For this reason, the amplifying device is capable of amplifying a high-slew-rate signal which may be high in strength and frequency without distorting the signal and outputting a resultant signal. Since the amplifying device reduces a current to be supplied if the slew rate of an input signal is low, it also can reduce power consumption.

It is to be understood that the above-described embodiment is illustrative only and not intended to be limiting. Although the number of bits in each of the AD converter 31 and DA converter 33 is set to 1 in the above embodiment, the number may be set to 2 or more. In the case of, e.g., two bits, "10" and "01" are alternately and repeatedly outputted as the value of the time difference signal S2 when the slew rate of the input signal S1 is low. When the slew rate increases to a certain degree, frequency with which "11" or "00" is outputted increases. Accordingly, the controlling unit 4 may generate the controlling signal CS on the basis of the frequency of "11" or "00".

If the slew rate of the input signal S1 is too high for the Δ modulator serving as the signal analyzing unit 3 to handle the input signal S1, an attenuator 5 is provided upstream of the input of the signal analyzing unit 3, as shown in FIG. 5.

The attenuator 5 can be composed of a resistor 51 and a variable resistor 52 as shown in FIG. 6. The degree of attenuation is adjusted by changing the resistance value of the variable resistor 52 on the basis of the magnitude of the slew rate of the input signal S1, characteristics of the Δ modulator, and the like.

The signal analyzing unit 3 may be configured such that an output from the AD converter 31 is directly inputted to the linear integrator 34, as shown in FIG. 7. This is because since "0" (or "1") as a digital signal is outputted from the AD converter 31, and the digital signal with the value of "0" (or "1") has a voltage value of, e.g., 0 V (or 1.5 V), the output can be used as an input to the linear integrator 34.

Although the signal analyzing unit 3 according to the above embodiment uses the linear integrator 34, the degree of integration may be increased to two or more according to the stability of the entire signal analyzing unit 3. An increase in the degree of integration allows finer control.

The amplifying device according to the above embodiment can be applied to, e.g., a cellular phone with a one-segment broadcast receiving function as shown in FIG. 8. The cellular phone includes a wireless communication unit 810 and a one-segment broadcast receiving unit 820.

The one-segment broadcast receiving unit 820 includes an antenna 821, an amplifying circuit 822, a mixer 823, an amplifying circuit 824, a filter 825, an AD converter 826, and a digital signal processing circuit 827. Operational amplifiers included in the amplifying circuit 824 and filter 825 are configured in the same manner as in the amplifying device according to the above embodiment.

The antenna 821 receives a broadcast signal whose frequency is about 470 to 770 MHz. The amplifying circuit 822 amplifies the received broadcast signal. The mixer 823 down-converts the amplified broadcast signal to a baseband signal. The amplifying circuit 824 amplifies the baseband signal.

The amplified baseband signal is supplied to the AD converter 826 through the filter 825 and is converted to a digital signal. The digital signal processing circuit 827 generates and outputs an image, voice, or the like using the digital signal.

A signal transmitted from an antenna 811 of the wireless communication unit 810 is a signal which is higher in frequency and strength, i.e., slew rate than a one-segment broadcast signal. The amplifying circuit 824 and filter 825 increase power consumption when such a signal serving as an interfering wave is issued from the antenna 811 and reduce power consumption when such a signal is not issued.

When a signal serving as an interfering wave is issued from the antenna 811, an interfering wave component contained in a signal outputted from the amplifying circuit 824 is removed by the filter 825.

Since a large current need not be constantly applied in preparation for a signal serving as an interfering wave issued from the antenna 811, it is possible to reduce power consumption and reduce costs.

The amplifying device according to the above embodiment can be applied to a device in which the slew rate of a signal transmitted and received varies greatly, such as a wireless LAN (IEEE802.11a/b/g/n) device.

What is claimed is:

1. An amplifying device comprising:
   an amplifier which amplifies an input signal supplied from an input terminal and outputs the amplified input signal;
   a feedback loop which has at least one of a resistive element and a capacitance connected between an output terminal of the amplifier and the input terminal;
   a variable current unit which adjusts a current value in accordance with a controlling signal and supplies an operating current to the amplifier;
   a signal analyzing unit which generates a time difference signal having a value corresponding to a slew rate of the input signal and outputs the time difference signal; and
   a controlling unit which generates the controlling signal in accordance with the time difference signal and outputs the controlling signal.

2. The amplifying device according to claim 1, wherein the signal analyzing unit comprises
   a delay element which delays the time difference signal by a predetermined time and outputs the time difference signal,
   a digital/analog converter which converts an output from the delay element to an analog signal and outputs the analog signal,
   an integrator which integrates an output from the digital/analog converter, and
   an analog/digital converter which converts a value obtained by subtracting an output from the integrator from the input signal to a digital signal and outputs the digital signal as the time difference signal.

3. The amplifying device according to claim 2, wherein the analog/digital converter converts the value obtained by subtracting the output from the integrator from the input signal to a 1-bit digital signal and outputs the digital signal as the time difference signal, and
   the controlling unit generates the controlling signal such that the operating current supplied to the amplifier by the variable current unit becomes large if a value of the time difference signal continues to be 1 over a predetermined number of cycles and generates the controlling signal such that the operating current supplied to the amplifier by the variable current unit becomes small if the value of the time difference signal continues to be 0 over the predetermined number of cycles.

4. The amplifying device according to claim 2, further comprising an attenuator which attenuates the input signal and outputs the input signal to the signal analyzing unit.

5. The amplifying device according to claim 4, wherein the attenuator comprises
   an impedance element having one end to which the input signal is supplied and the other end connected to an output terminal of the attenuator and
   a variable resistor having one end grounded and the other end connected to the other end of the impedance element and the output terminal of the attenuator.

6. The amplifying device according to claim 1, wherein the signal analyzing unit comprises
an integrator which integrates the time difference signal and
an analog/digital converter which converts a value obtained by subtracting an output from the integrator from the input signal to a digital signal and outputs the digital signal as the time difference signal.

7. The amplifying device according to claim 6, wherein the analog/digital converter converts the value obtained by subtracting the output from the integrator from the input signal to a 1-bit digital signal and outputs the digital signal as the time difference signal, and
the controlling unit generates the controlling signal such that the operating current supplied to the amplifier by the variable current unit becomes large if a value of the time difference signal continues to be 1 over a predetermined number of cycles and generates the controlling signal such that the operating current supplied to the amplifier by the variable current unit becomes small if the value of the time difference signal continues to be 0 over the predetermined number of cycles.

8. The amplifying device according to claim 6, further comprising an attenuator which attenuates the input signal and outputs the input signal to the signal analyzing unit.

9. The amplifying device according to claim 8, wherein the attenuator comprises
an impedance element having one end to which the input signal is supplied and the other end connected to an output terminal of the attenuator and
a variable resistor having one end grounded and the other end connected to the other end of the impedance element and the output terminal of the attenuator.

10. A radio comprising:
a wireless communication unit which transmits and receives a wireless communication signal;
an antenna which receives a broadcast signal;
a first amplifying circuit which amplifies the broadcast signal received by the antenna;
a mixer which downconverts an output signal from the first amplifying circuit to a baseband signal;
a second amplifying circuit which amplifies the baseband signal and has an amplifying device including an amplifier that amplifies an input signal supplied from an input terminal and outputs the input signal, a feedback loop that has at least one of a resistive element and a capacitance connected between an output terminal of the amplifier and the input terminal, a variable current unit that adjusts a current value in accordance with a controlling signal and supplies an operating current to the amplifier, a signal analyzing unit that generates a time difference signal having a value corresponding to a slew rate of the input signal and outputs the time difference signal, and a controlling unit that generates the controlling signal in accordance with the time difference signal and outputs the controlling signal;
a filter which receives an output signal from the second amplifying circuit;
an analog/digital converter which analog/digital-converts an output signal from the filter and outputs a digital signal; and
a digital signal processing circuit which decodes the digital signal.

* * * * *